United States Patent
Rokugo

[19]

[11] Patent Number: 5,864,248
[45] Date of Patent: Jan. 26, 1999

[54] PHASE-LOCKED LOOP CIRCUIT FOR REPRODUCING CLOCK SIGNALS SYNCHRONIZED WITH TRANSMITTER IN RECEIVER

[75] Inventor: Yoshinori Rokugo, Tokyo, Japan

[73] Assignee: NEC Corporation, Tokyo, Japan

[21] Appl. No.: 746,847

[22] Filed: Nov. 18, 1996

[30]     Foreign Application Priority Data

Nov. 20, 1995   [JP]   Japan .................................. 7-301056

[51] Int. Cl.⁶ ...................................................... H03L 7/08
[52] U.S. Cl. .......................................... 327/156; 375/376
[58] Field of Search ................................... 327/147–151, 327/155, 156–161; 331/17, 25, 27; 375/373, 375, 376, 327

[56]                  References Cited

U.S. PATENT DOCUMENTS

| | | | |
|---|---|---|---|
| 3,944,940 | 3/1976 | Desai ....................................... | 329/122 |
| 4,633,193 | 12/1986 | Scordo .................................... | 331/1 A |
| 5,390,180 | 2/1995 | Reilly ....................................... | 370/84 |
| 5,475,325 | 12/1995 | Nezu ........................................ | 327/147 |
| 5,486,792 | 1/1996 | Girardeau, Jr. ......................... | 327/156 |
| 5,488,636 | 1/1996 | Yamada et al. ........................... | 327/91 |
| 5,525,935 | 6/1996 | Joo et al. ................................. | 327/156 |
| 5,612,981 | 3/1997 | Huizer ..................................... | 327/159 |

FOREIGN PATENT DOCUMENTS

| | | |
|---|---|---|
| 0 590 323 A1 | 8/1993 | European Pat. Off. . |
| 0 615 360 A2 | 1/1994 | European Pat. Off. . |
| 62-137936 | 6/1987 | Japan . |
| 5037560 | 2/1993 | Japan . |
| 5048562 | 2/1993 | Japan . |
| 7066814 | 3/1995 | Japan . |

OTHER PUBLICATIONS

"A Survey of Digital Phase–Locked Loops", by William C. Lindsey and Chak Ming Chie, Proceedings of the IEEE, vol. 69, No. 4, Apr. 1981.

Electronic Information Society Technological Report, CAS 92–117 (CS92–106, DSP92–106) H. Uematsu, et al. (NTT Transfer Systems Research Laboratory), "Method of Clock Frequency Transmission Using SRTS in ATM Networks," Mar. 1993, pp. 55–62.

Garodnick et al., "Response of an All Digital Phase–Locked Loop" IEEE Transactions on Communications, vol. Com–22, No. 6, (1974), pp. 751–764.

*Primary Examiner*—My-Trang Nu Ton
*Attorney, Agent, or Firm*—Foley & Lardner

[57]              ABSTRACT

A phase-locked loop circuit comprising a received data counter for counting received clock signals reproduced according to sent data count values output from a transmitter, a subtracter for subtracting the output of the received data counter from an entered sent data count value, first and second attenuators for attenuating the output of the subtracter, an integrator for integrating the output of the second attenuator, an adder for adding the output of the first attenuator to the output of the integrator, a converter for converting the output of the adder into the corresponding voltage signal, and a voltage control oscillator that is controlled by the output of the converter and outputs a received clock signal to be supplied to the received data counter.

6 Claims, 9 Drawing Sheets

PHASE-LOCKED LOOP CIRCUIT FOR REPRODUCING CLOCK SIGNALS SYNCHRONIZED WITH TRANSMITTER IN RECEIVER

BACKGROUNDS OF THE INVENTION

1. Field of the Invention

The present invention relates to a phase-locked loop (hereinafter referred to as the "PLL") circuit used in a receiver to reproduce clock signals synchronized with a transmitter in a communications system, in particular, to a PLL circuit for reproducing clocks from time data sent at random temporal intervals.

2. Description of the Related Art

As a typical means for reproducing clocks synchronized with a transmitter in a receiver in a communications system, a PLL method is used which reproduces clocks by demodulating, in the receiver, temporal data modulated and superposed on sent signals in the transmitter. The PLL method is, for example, described in document ITU-T (recommendation H.220.0).

Particularly, when digital signals are used to transmit data between a transmitter and a receiver, a digital signal processing type PLL (hereinafter referred to as the "DPLL") method is applied which converts analog phase data into the corresponding digital data, then performs digital signal processing for clock reproduction. The DPLL method is, for example, described in a document, "Response of an All Digital Phase-locked Loop" (Joseph Garodnick, et al, IEEE TRANS. COMM. Vol. COM-22, No. 6, June 1974, pp751–764).

Figure 9:
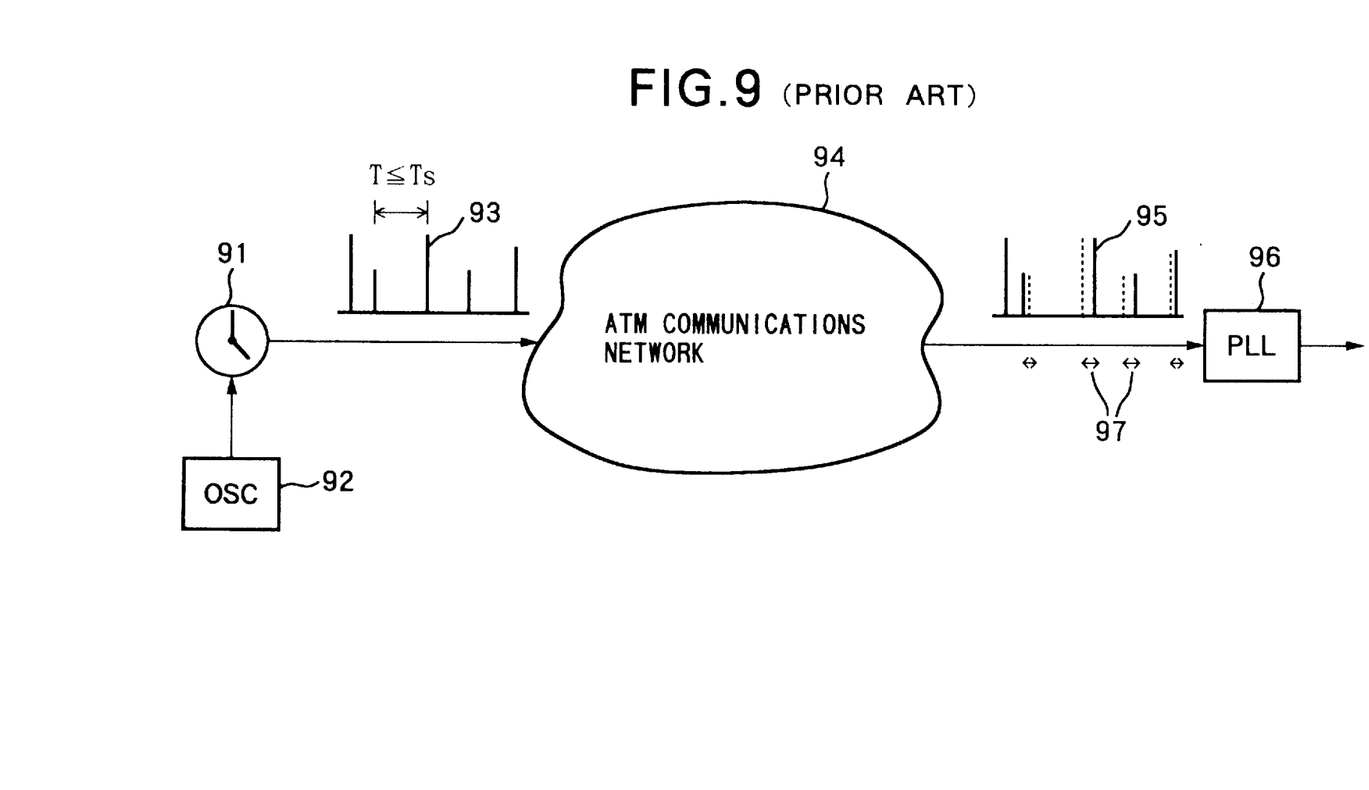
FIG. 9 provides a conceptual schema for a typical phase synchronization system.

The above phase-locked loop methods based on prior art including DPPL are accompanied by the problem that they cannot control phase fluctuation (jitters) that occurs in the vicinity of a sampling frequency. This means that an asynchronous communications network cannot be used as a communications network for connecting a transmitter and a receiver. For example, as shown in FIG. 9 where a transmitter and a receiver are connected via an ATM (async transfer mode) communications network 94, time data is read in the transmitter at random intervals from a timer counter 91 that counts time according to clocks with frequency fs (Hz) from a send reference clock source (OSC) 92, and sent to the ATM communications network 94 as time data 93. The time data 93 is read from the timer counter 91 at certain random intervals within Ts seconds, and its value (height) indicates elapsed time T from the previous reading.

The receiver receives time data 93 as received time data 95 via the ATM communications network 94. And clocks are reproduced by a PLL circuit 96. The time when received time data 95 arrives is varied by cell delay variation (hereinafter referred to as "CDV") in the ATM communications network 94.

Now that time data is expressed as 2 πfs·nT, CDV in the ATM communications network 94 appears as phase fluctuation (jitters) 97. The past DPLL circuit based on prior art cannot control such phase fluctuation and, thus, causes signal quality deterioration. An async communications network cannot, therefore, be used as a communications network for connecting a transmitter and a receiver.

It is well known that a second-order PLL circuit has been developed which can implement control over same P—P value jitters. Also, a third-order PLL circuit that can reduce system pull-in time very much has been designed successfully. But, the past third-order PLL circuit that uses a dual integrator as the filter suffers the problem that it is not stable against high jitters.

SUMMARY OF THE INVENTION

It is a first objective of the present invention to provide a PLL circuit that can control phase fluctuation occurring in the vicinity of a sampling frequency and that can reproduce high-accuracy stable clocks even if an async communications network is used as a communications network for connecting a transmitter and a receiver.

It is a second objective of the present invention to implement the stable reproduction of high-accuracy clocks as the first objective by a simple circuit configuration.

It is a third objective of the present invention to provide a third-order PLL circuit that is highly stable against high jitters and that can reduce system pull-in time in comparison with a second-order PLL circuit implementing control over same P—P value jitters.

It is a fourth objective of the present invention to implement the third-order PLL circuit as the third objective by a simple circuit configuration.

According to one aspect of the invention, a phase-locked loop circuit in a receiver for reproducing clock signals synchronized with a transmitter, comprises a received data counter for counting received clock signals reproduced according to a sent data count value output from said transmitter;

a subtracter for subtracting the output of said received data counter from an entered sent data count value;

first and second attenuators for attenuating the output of said subtracter;

an integrator for integrating the output of said second attenuator;

an adder for adding the output of said first attenuator to the output of said integrator;

a converter for converting the output of said adder into the corresponding voltage signal; and a voltage control oscillator that is controlled by the output of said converter and outputs said received clock signal to be supplied to said received data counter.

In the preferred construction, the integrator comprises a memory circuit for temporarily storing an input signal to be output; a delay circuit for delaying the output of said memory circuit by one sample; and an adder for adding the output of said second attenuator to the output of said delay circuit for supply to said memory circuit.

In another preferred construction, the received data counter has the same configuration as a timer counter for outputting time data according to reference clocks in a transmitter, and outputs time data according to received clocks generated in said voltage control oscillator.

According to another aspect of the invention, a phase-locked loop circuit in a receiver for reproducing clock signals synchronized with a transmitter; comprises a received data counter for counting reproduced received clock signals according to sent data count values output from said transmitter;

a subtracter for subtracting the output of said received data counter from an entered sent data count value;

a first-order low-pass filter for filtering the output of said subtracter;

first and second attenuators for attenuating the output of said first-order low-pass filter;

an integrator for integrating the output of said second attenuator;

an adder for adding the output of said first attenuator to the output of said integrator;

a converter for converting the output of said adder into the corresponding voltage signal; and a voltage control oscillator that is controlled by the output of said converter and outputs said received clock signals to be supplied to said received data counter.

In the preferred construction, the integrator comprises a memory circuit for temporarily storing an input signal to be output; a delay circuit for delaying the output of said memory circuit by one sample; and an adder for adding the output of said second attenuator to the output of said delay circuit for supply to said memory circuit.

Also, the first-order low-pass filter comprises a plurality of delay circuits connected in series for delaying and issuing output of said subtracter in sequence and for shifting a held value to the next-stage delay circuit in sequence whenever the output of said subtracter is entered; and an adder/divider for adding and summing up the output of said subtracter and the output of said delay circuits and for dividing the result of this addition by the number of stages in said delay circuits.

In another preferred construction, the first-order low-pass filter comprises a plurality of delay circuits connected in series for delaying and issuing the output of said subtracter in sequence and for shifting a held value to the next-stage delay circuit in sequence whenever the output of said subtracter is entered; and an adder/divider for adding and summing up the output of said subtracter and the output of said delay circuit and for dividing the result of this addition by the number of stages in said delay circuits; and the integrator comprises a memory circuit for temporarily storing an input signal to be output; a delay circuit for delaying the output of said memory circuit by one sample; and an adder for adding the output of said second attenuator to the output of said delay circuit for supply to said memory circuit.

Also, the first-order low-pass filter comprises a delay circuit for delaying input by one sample; a first multiplier for multiplying the output of said delay circuit; a subtracter for subtracting the output of said first multiplier from the output of said subtracter and for supplying the result of this subtraction to said delay circuit; an adder for adding the output of said first multiplier to the output of said subtracter; and a second multiplier for multiplying the output of said adder.

In another preferred construction, the first-order low-pass filter comprises a delay circuit for delaying input by one sample; a first multiplier for multiplying the output of said delay circuit; a subtracter for subtracting the output of said first multiplier from the output of said subtracter and for supplying the result of this subtraction to said delay circuit; an adder for adding the output of said first multiplier to the output of said subtracter; and a second multiplier for multiplying the output of said adder; and the integrator comprises a memory circuit for temporarily storing an input signal to be output; a delay circuit for delaying the output of said memory circuit by one sample; and an adder for adding the output of said second attenuator to the output of said delay circuit for supply to said memory circuit.

Other objectives, feature and effects of the present invention will be clearly understood from the following detailed description.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENTS

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
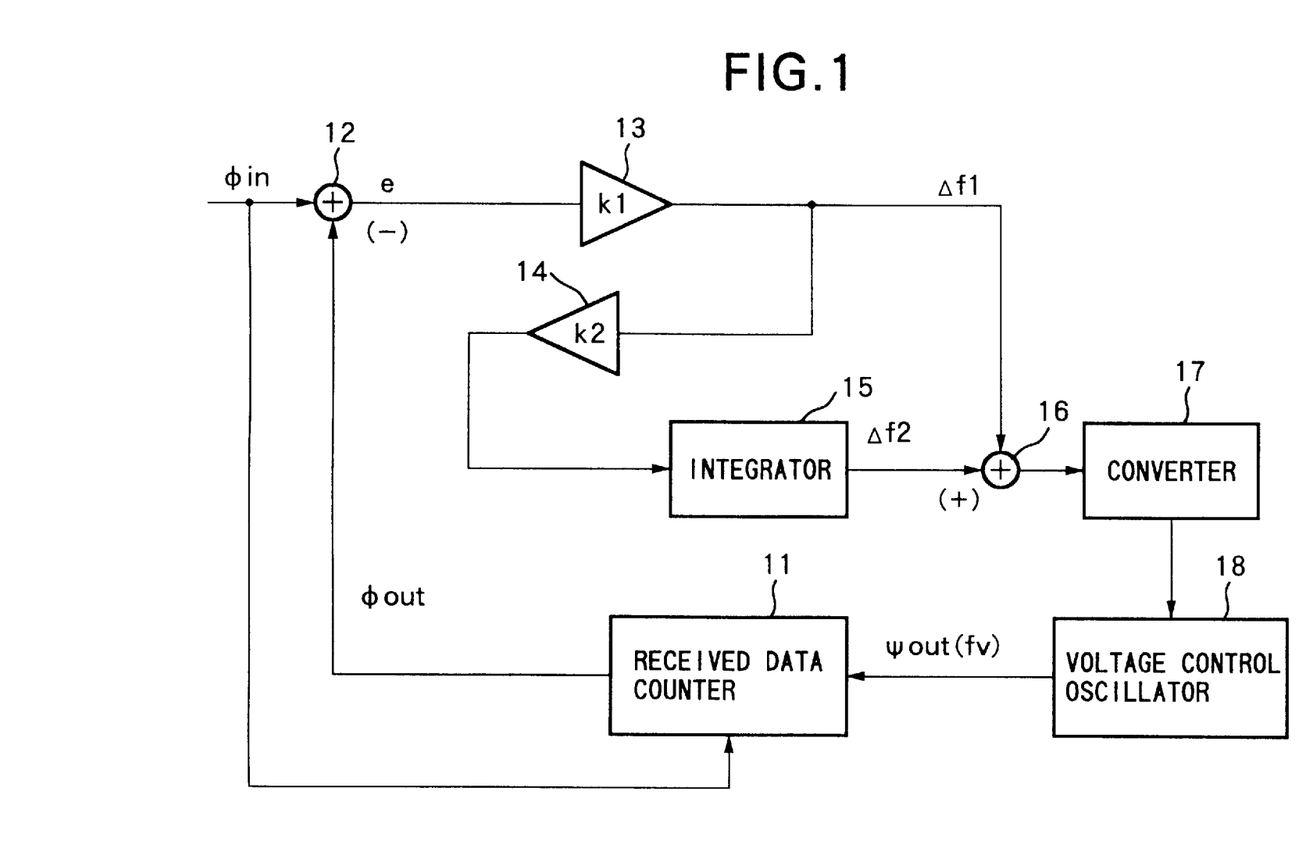
FIG. 1 provides a block diagram that illustrates the configuration of a PLL circuit as the first preferred embodiment of the present invention.

FIG. 1 provides the block diagram that shows the phase-locked loop circuit as the first preferred embodiment of the present invention. This preferred embodiment covers a PLL circuit for a receiver in a phase synchronization system connected via an ATM communications network shown in FIG. 9.

As shown in FIG. 1, the PLL circuit as the first preferred embodiment comprises a received data counter 11, a subtracter 12 which subtracts the output φout of the received data counter 11 from a sent data count value φin, attenuators 13 and 14 which attenuate the output of the subtracter 12, an integrator 15 which integrates the output of the attenuator 14, an adder 16 which adds the output of the attenuator 13 to the output of the integrator 15, a converter 17 which converts the output of the adder 16 into the corresponding voltage signal, and a voltage control oscillator 18 that is controlled by the output of the converter 17 and outputs a clock signal ψout (fv). In FIG. 1, only the characteristic configuration is covered, and the other general configurations are omitted.

The received data counter 11 counts received clock signals ψout (fv) generated in the voltage control oscillator 18. The received data counter has the same configuration as a timer counter (see FIG. 9) that outputs time data in a transmitter according to reference clocks. The adder 12 receives sent data count value φin as time data out of output signals from the transmitter acquired via an ATM communications network. Whenever a count value is received, count value φout as the output of the received data counter 11 is subtracted from sent data count value φin. The attenuator 13 attenuates the output of the subtracter 12 by gain k1. The attenuator 14 attenuates output Δf1 of the attenuator 13 by gain k2. The adder 16 adds output Δf1 of the attenuator 13 to output Δf2 of the integrator 17. The converter 17 converts the output of the adder 16 into the corresponding voltage signal to be output. The output of the converter 17 is held until next sent data count value φin is received and a new output signal of the adder 16 is entered and converted into the corresponding voltage signal. The voltage control oscillator 18, which provides gain A, generates and outputs received clock signal ψout (fv) with a certain frequency according to a voltage signal entered from the converter 17.

Figure 2:
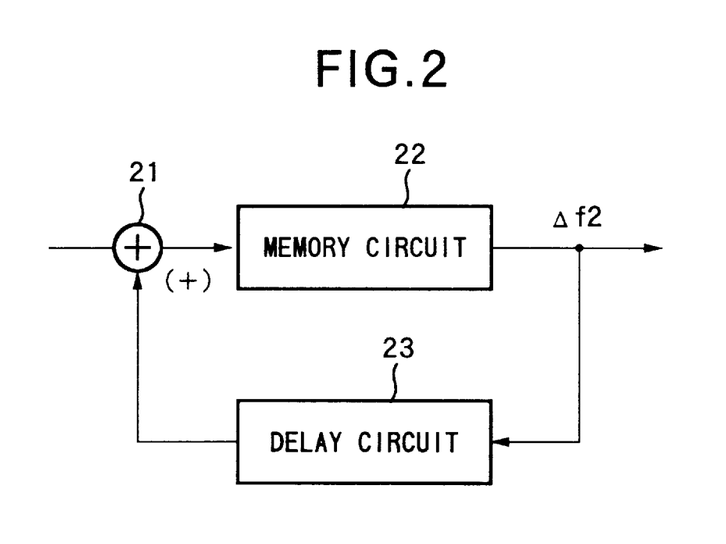
FIG. 2 provides a block diagram that shows the configuration of an integrator used in the first preferred embodiment.

FIG. 2 provides the block diagram that shows the configuration of the integrator 15. As shown therein, the integrator 15 comprises a memory circuit 22 that temporarily stores an input signal to be output as Δf2, a delay circuit 23 that delays output Δf2 of the memory circuit 22 by a sampling period, and an adder 21 which adds the output of the attenuator 14 to the output of the delay circuit 23 for entry to the memory circuit 22. By the integrator, the output of the attenuator 14 is integrated in sequence, being issued as output Δf2.

Next, the operation of this preferred embodiment is explained by referring to FIGS. 1 and 2.

When sent data count value φin is received from the transmitter, count value φout is read from the received data counter 11, and subtracted from sent data count value φin in the subtracter 12. The result of this subtraction, or differential output e corresponding to the phase difference between sent data count value φin and count value φout, is entered to the attenuator 13, becoming output Δf1 attenuated by gain k1. And output Δf1 is supplied to the attenuator 14 and the adder 16.

Output Δf1 of the attenuator 13 entered to the attenuator 14 is further attenuated by gain k2, and entered to the integrator 15. The result of integration by the integrator 15, or output Δf2, is obtained.

In the adder 16, output Δf1 of the attenuator 13 is added to output Δf2 of the integrator 15. The result of this addition is converted by the converter 17 into the corresponding voltage signal, which is supplied to the voltage control oscillator 18.

Thus, clock signal ψout (fv) with the frequency corresponding to the output of the adder 16 is reproduced and output from the voltage control oscillator 18 as a received clock. Count value φout is updated in sequence in the received data counter 11 according to clock signal ψout (fv).

Actually, phase transfer characteristics Y2(S) of the PLL circuit as the first preferred embodiment are obtained by the Laplace transformation of a phase ratio of φin and φout as expressed in formula (1). Those characteristics are transfer characteristics of the typical second-order PLL circuit.

$$Y2(S) = \frac{\Phi out}{\Phi in} = \frac{\frac{S}{K2} + 1}{1 + \frac{S}{K2} + \frac{S^2}{A \cdot k1 \cdot k2}} \quad (1)$$

Damping factor ζ and angular natural frequency ω are given by formula (2). Now, transfer characteristics of the typical second-order PLL circuit are obtained as shown in formula (3).

$$\left. \begin{array}{l} \zeta = \frac{1}{2} \sqrt{\frac{A \cdot k1}{k2}} \\ \omega_n = \sqrt{A \cdot k1 \cdot k2} \ [rad/s] \end{array} \right\} \quad (2)$$

$$Y2(S) = \frac{1 + 2\zeta \left( \frac{S}{\omega_n} \right)}{1 + 2\zeta \frac{S}{\omega_n} + \left( \frac{S}{\omega_n} \right)^2} \quad (3)$$

Replacing jω by S leads to formula (4) for square gain |Y(ω)|². Furthermore, jitter band Bj for the PLL circuit is given by formula (5).

$$|Y(\omega)|^2 = \frac{1 + 4\left( \zeta \frac{\omega}{\omega_n} \right)^2}{1 + 2(2\zeta^2 - 1)\left( \frac{\omega}{\omega_n} \right)^2 + \left( \frac{\omega}{\omega_n} \right)^4} \quad (4)$$

$$Bj = \int_0^\infty |Y(\omega)|^2 d\omega = \frac{\pi}{2} \omega_n \left( \frac{1}{2\zeta} + 2\zeta \right) [rad/s] \quad (5)$$

$$= \frac{1}{4} (A \cdot k1 + k2)[Hz]$$

Thus, the typical second-order PLL circuit is implemented by the first preferred embodiment shown in FIGS. 1 and 2.

Pull-in time Tc for the entire system, which can be considered as being the superposition of the first- and second-order loops, is given by formula (6).

$$2.3Tc = 2.3(T1 + T2) = 2.3 \left( \frac{1}{k1 \cdot A} + \frac{1}{k1 \cdot k2 \cdot A} \right) [s] \quad (6)$$

T1 indicates the pull-in time of the first-order loop, while T2 indicates the pull-in time of the second-order loop.

Figure 3:
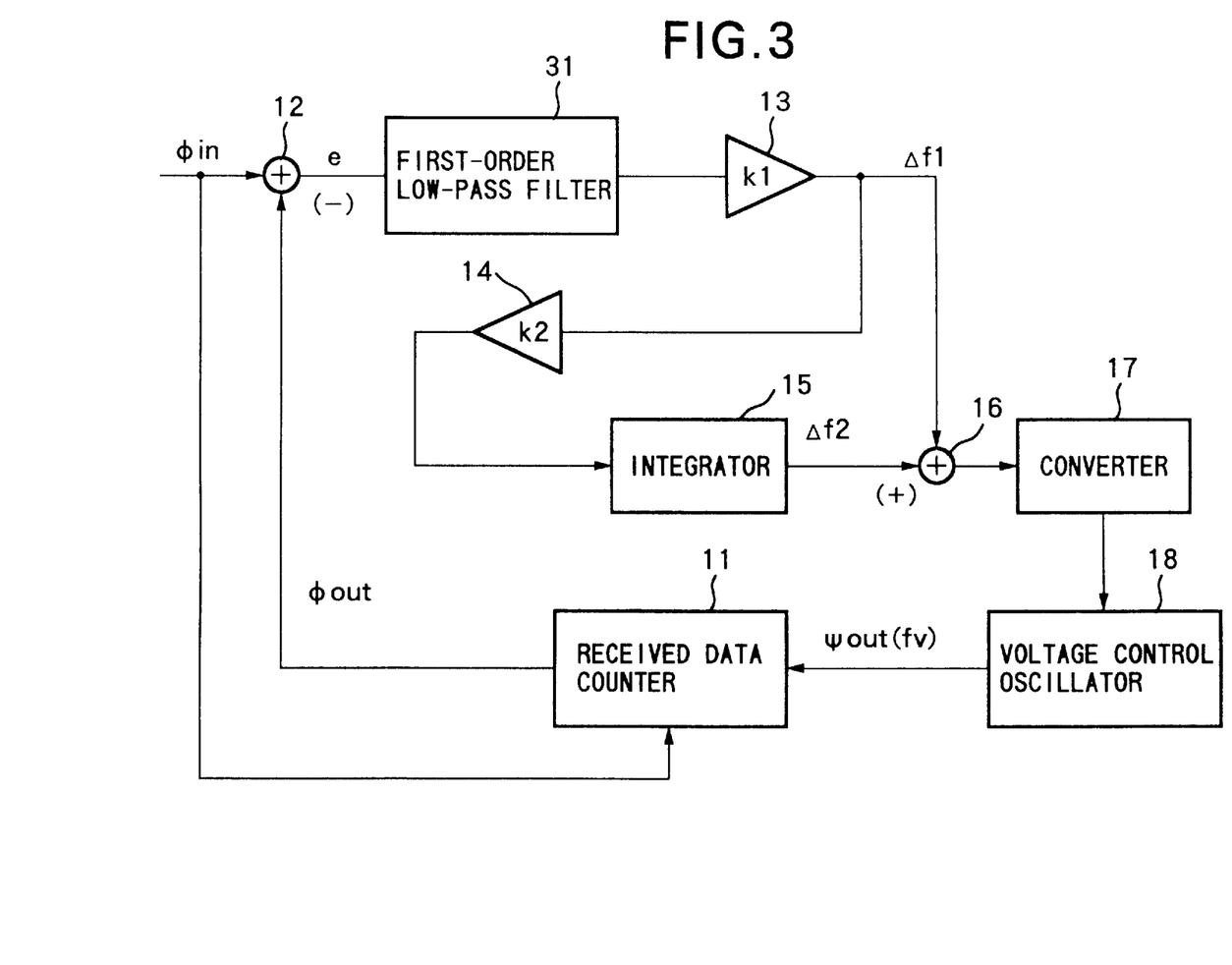
FIG. 3 provides a block diagram that illustrates the configuration of a PLL circuit as the second preferred embodiment of the present invention.

FIG. 3 provides the block diagram that shows the configuration of the PLL circuit as the second preferred embodiment of the present invention.

As shown therein, the PLL circuit as the second preferred embodiment comprises a received data counter 11, a subtracter 12 which subtracts output φout of the received data counter 11 from sent data count value φin, a first-order low-pass filter 31 that filters the output of the subtracter 12, attenuators 13 and 14 which attenuate the output of the first-order low-pass filter 31, an integrator 15 which integrates the output of the attenuator 14, an adder 16 which adds the output of the attenuator 13 to the output of the integrator 15, a converter 17 which converts the output of the adder 16 into the corresponding voltage signal, and a voltage control oscillator 18 that is controlled by the output of the converter 17 and outputs clock signal ψout (fv). Only the characteristic configuration of the preferred embodiment is covered in FIG. 1, and the other general configurations are omitted.

In the above configuration, the received data counter 11, the subtracter 12, the attenuators 13 and 14, the integrator 15, the adder 16, the converter 17, and the voltage control oscillator 18 are the same as those in the first preferred embodiment shown in FIG. 1. Those components are assigned the same numbers as for the first preferred embodiment, and their explanation is omitted.

Figure 4:
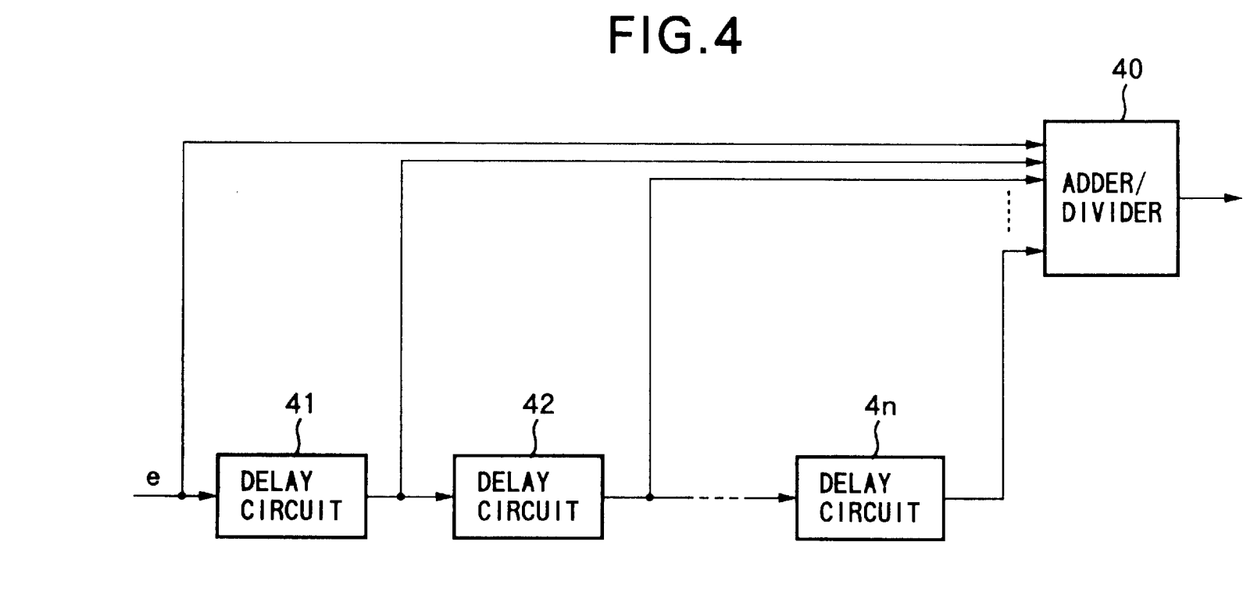
FIG. 4 provides a block diagram that shows the configuration of a first-order low-pass filter used in the second preferred embodiment of the present invention.

FIG. 4 provides the block diagram that shows the configuration of the first-order low-pass filter 31. The first-order low-pass filter 31 covered in FIG. 4 comprises a moving average calculation circuit having delay circuits 41 to 4n connected in series and an adder/divider 40. The delay circuits 41 to 4n shift a held value to the next-stage delay circuit whenever output e of the subtracter 12 is entered. In other words, the values held in delay circuits 41 to 4n-1 are shifted to the next-stage delay circuits 42 to 4n, respectively. The adder/divider 40 adds and sums up output e of the subtracter 12 and the output of the delay circuits 41 to 4n, and divides the result by the number of stages of delay circuits 41 to 4n. Then, calculations of moving average processing are output to the attenuator 13.

Figure 5:
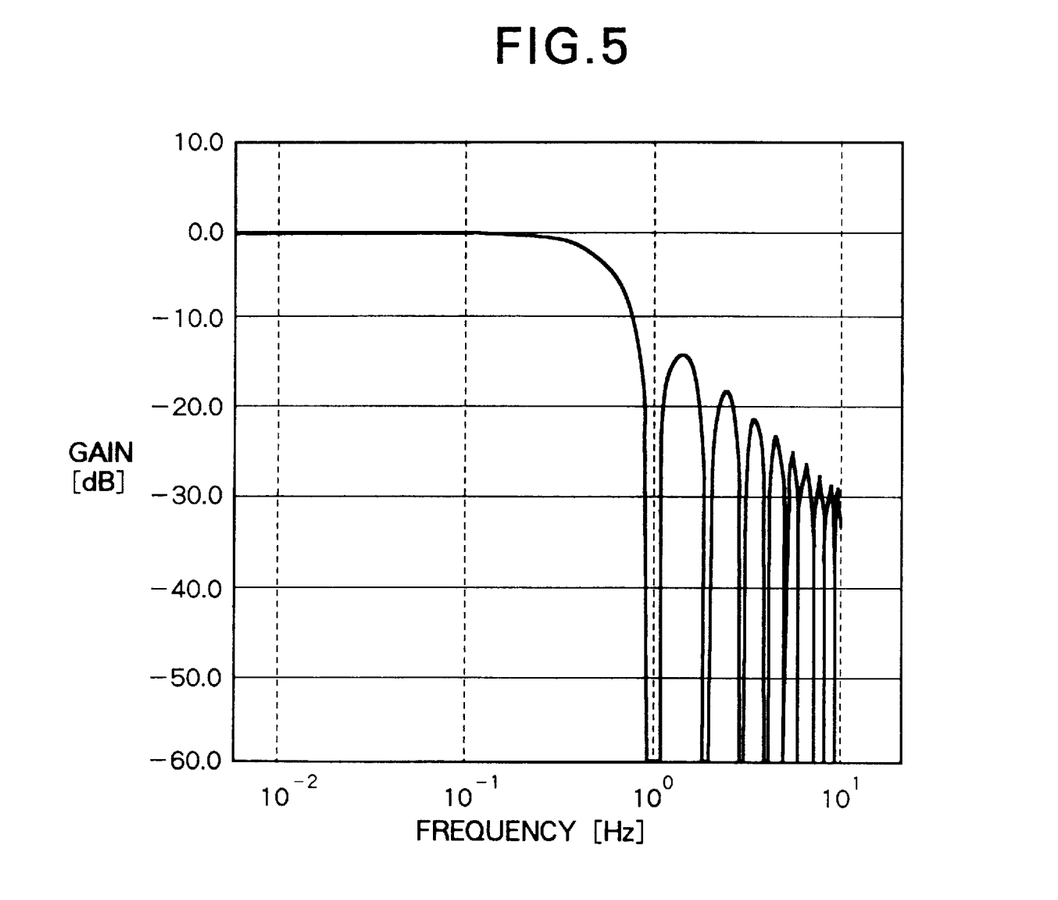
FIG. 5 illustrates frequency characteristics of the first-order low-pass filter shown in FIG. 4.

FIG. 5 shows frequency characteristics of the first-order low-pass filter covered in FIG. 4. Frequency fτ is expressed by the inverse of τ=n×Δt where Δt stands for the average sampling interval, or mean temporal data arrival time, and n for the number of delay circuit stages.

Figure 6:
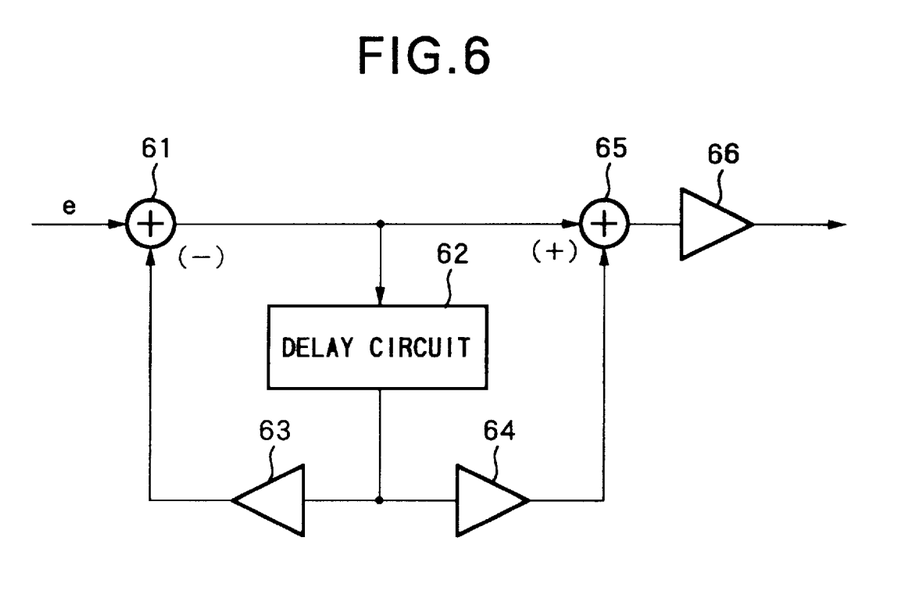
FIG. 6 provides a block diagram that shows another configuration of the first-order low-pass filter used in the second preferred embodiment of the present invention.

FIG. 6 provides the block diagram that shows another configuration of the first-order low-pass filter 31. As shown in FIG. 6, the first-order low-pass filter comprises a subtracter 61, a delay circuit 62, multipliers 63, 64 and 66, and an adder 65. A value entered to the delay circuit 62 is delayed by one sample, and passed via the multipliers 63 and 64 to the subtracter 61 and the adder 65, respectively. Whenever output e of the subtracter 12 is received, the subtracter 61 subtracts the output of the multiplier 63 from output e, and supplies the result of this subtraction to the delay circuit 62 and the adder 65. Whenever output e of the subtracter 12 is received, the adder 65 adds the output of the subtracter 61 to the output of the multiplier 66, and outputs the result of this addition via the multiplier to the attenuator 13.

Figure 7:
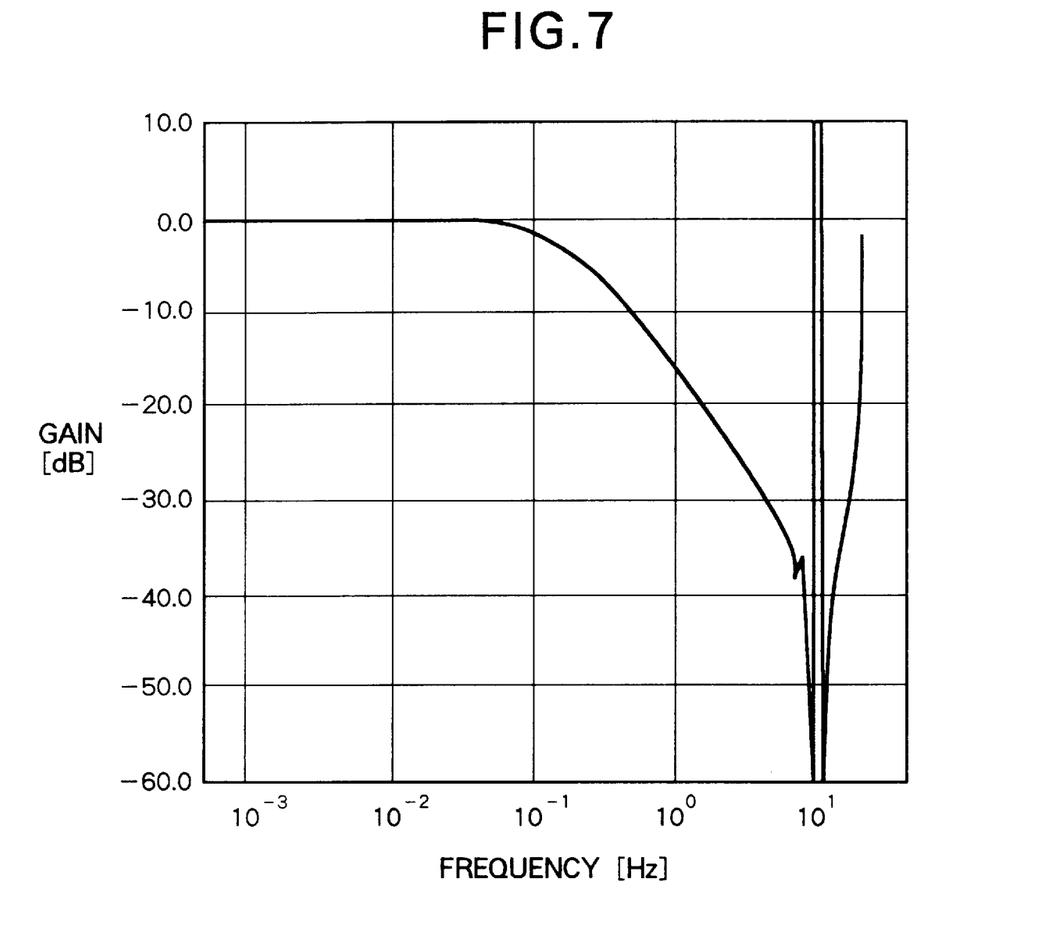
FIG. 7 illustrates frequency characteristics of the first-order low-pass filter shown in FIG. 6.

FIG. 7 illustrates frequency characteristics of the first-order low-pass filter shown in FIG. 6. FIG. 7 tells that, if time data is periodic data, characteristics are looped back and unstable at the ½ point of the arrival frequency of time data.

If characteristics of the first-order low-pass filter are written as H(S), phase transfer characteristics of the PLL circuit as the second preferred embodiment are expressed actually by formula (7), indicating transfer characteristics of the third-order PLL circuit.

$$Y3(S) = \frac{\Phi_{out}}{\Phi_{in}} = \frac{\frac{S}{k2} + 1}{1 + \frac{S}{k2} + \frac{S^2}{H(S) \cdot A \cdot k1 \cdot k2}} \quad (7)$$

First-order low-pass cut-off characteristics H(S) are given by formula (8), where τ1 stands for a filter time constant. Now that damping factor ζ and angular natural frequency ω are given by formula (2), transfer characteristics of the third-order PLL circuit are obtained from formula (9).

$$H(S) = \frac{1}{\tau 1 \cdot S + 1} \quad (8)$$

$$Y3(S) = \frac{1 + 2\zeta\left(\frac{S}{\omega_n}\right)}{1 + 2\zeta\frac{S}{\omega_n} + \frac{S^2}{\omega_n^2} + \frac{\tau 1 \cdot S^3}{\omega_n^2}} \quad (9)$$

Replacing jω by S provides formula (10) for $|Y(\omega)|^2$. This formula can be applied practically if conditions covered in formula (11) are satisfied.

$$|Y(\omega)|^2 = \frac{1 + 4\left(\zeta\frac{\omega}{\omega_n}\right)}{1 + 2(2\zeta^2 - 1)\left(\frac{\omega}{\omega_n}\right)^2 + (1 - 4\zeta(\tau 1)\omega_n)\left(\frac{\omega}{\omega_n}\right)^4 + (\tau 1)^2\omega_n^2\left(\frac{\omega}{\omega_n}\right)^6} \quad (10)$$

$$\left.\begin{array}{l} 1 - 4\zeta(\tau 1)\omega_n \approx 0 \text{ or } \geq 0 \\ \zeta \geq 1 \end{array}\right\} \quad (11)$$

In the way described above, the third-order PLL circuit can be implemented by the second preferred embodiment covered in FIGS. 3, 4 and 6.

Pull-in time Tc for the entire system, which can be considered as being the sum of pull-in time in subsystems, can be expressed by formula (12).

$$2.3Tc = 2.3(T1 + T2) = 2.3\left(\tau 1 + \frac{1}{k1 \cdot A} + \frac{1}{k1 \cdot k2 \cdot A}\right) [s] \quad (12)$$

Figure 8:
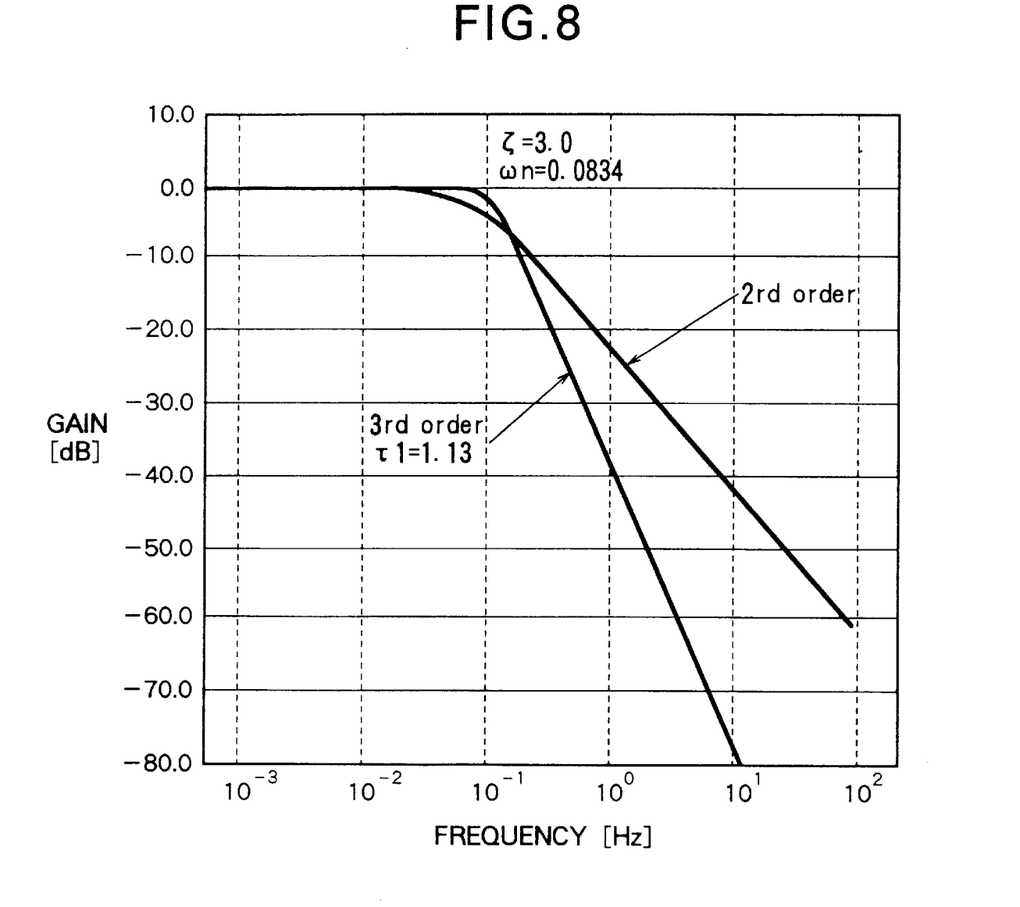
FIG. 8 compares frequency response characteristics of the PLL circuits as the first and second preferred embodiments.

Hence, the first and second preferred embodiments of the present invention provide frequency response characteristics as shown in FIG. 8. FIG. 8 shows damping factor ζ, angular natural frequency ωn and filter time constant τ1 under the same conditions.

As shown in FIG. 8, while the second-order PLL circuit as the first preferred embodiment provides jitter control characteristics of 20 dB/dec in the range over the cut-off frequency, the third-order PLL circuit as the second preferred embodiment implements jitter control characteristics of 40 dB/dec.

The past third-order PLL circuit that uses a dual integrator as the filter is accompanied by the problem that it is unstable against high jitters. But, the third-order PLL circuit as the second preferred embodiment is highly stable against amplitude jitters since one integrator 15 is located in the preceding stage of the converter 17 and the first-order low-pass filter is installed.

Moreover, the third-order PLL circuit as the second preferred embodiment can significantly reduce system pull-in time in comparison with the second-order PLL circuit that controls same P—P value jitters.

As explained above, the PLL circuit of the present invention feeds back a received data count value generated according to a reproduced received clock signal for comparison with a sent data count value in an input signal and for the timely correction of a received clock signal. Phase fluctuation (jitter) occurring in the vicinity of a sampling frequency can, therefore, be controlled. Thus, for example, even if an ATM (async transfer mode) communications network is used to connect a transmitter and a receiver, clocks can be reproduced accurately and stably.

Furthermore, the integrator used to correct received clock signals comprises the memory circuit for temporarily storing input, the delay circuit for delaying output from the memory circuit by one sample, and the adder for adding an input signal and an output signal from the delay circuit for supply to the memory circuit. The PLL circuit can, therefore, be implemented by a relatively simple circuit configuration.

In addition, the first-order low-pass filter for low-pass filtering the differential signal between a received data count value and a sent data count value is installed to implement the third-order PLL circuit. Hence, the third-order PLL circuit is significantly stable against high jitters, and can advantageously reduce system pull-in time in comparison with the second-order PLL circuit that can control same P—P value jitters.

Moreover, since the first-order low-pass filter comprises the moving average calculation circuit having the delay circuits 41 to 4n connected in series and the adder/divider 40, the third-order PLL circuit can be implemented by a relatively simple circuit configuration.

Also, the first-order low-pass filter comprises the delay circuit for delaying input by one sample, the first multiplier for multiplying the output of the delay circuit, the subtracter for subtracting the output of the first multiplier from an input signal value and for supplying the result of this subtraction to the delay circuit, the adder for adding the output of the first multiplier to the output of the subtracter, and the second multiplier for multiplying the output of the adder. The third-order PLL circuit can, therefore, be implemented by a relatively simple circuit configuration.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A phase-locked loop circuit in a receiver for reproducing clock signals synchronized with a transmitter, comprising:
    a received data counter for counting reproduced received clock signals according to a sent data count value output from said transmitter;
    a subtracter for subtracting an output of said received data counter from said sent data count value;
    a first-order low-pass filter for filtering an output of said subtracter;
    first and second attenuators for attenuating an output of said first-order low-pass filter;
    an integrator for integrating an output of said second attenuator;
    an adder for adding an output of said first attenuator to an output of said integrator;
    a converter for converting an output of said adder into a corresponding voltage signal; and
    a voltage control oscillator that is controlled by an output of said converter and outputs said reproduced received clock signals to be supplied to said received data counter, wherein said received data counter also directly receives said sent data count value.

2. A phase-locked loop circuit as set forth in claim 1, said first-order low-pass filter comprising:
    a plurality of delay circuits connected in series for delaying and issuing the output of said subtracter in sequence and for shifting a held value to the next-stage delay circuit in sequence whenever the output of said subtracter is entered; and
    an adder/divider for adding and summing up the output of said subtracter and an output of said delay circuits and for dividing the result of this addition by the number of stages in said delay circuits.

3. A phase-locked loop circuit as set forth in claim 1, said first-order low-pass filter comprising:
    a delay circuit for delaying input by one sample;
    a first multiplier for multiplying an output of said delay circuit;
    a second subtracter for subtracting an output of said first multiplier from the output of said subtracter and for supplying a result of this subtraction to said delay circuit;
    an adder for adding the output of said first multiplier to the output of said second subtracter; and
    a second multiplier for multiplying an output of said adder.

4. A phase-locked loop circuit in a receiver for reproducing clock signals synchronized with a transmitter comprising:
    a received data counter for directly counting reproduced received clock signals according to sent data count values output from said transmitter;
    a subtracter for subtracting an output of said received data counter from said sent data count value;
    a first-order low-pass filter for filtering an output of said subtracter;
    first and second attenuators for attenuating an output of said first-order low-pass filter;
    an integrator for integrating an output of said second attenuator;
    an adder for adding an output of said first attenuator to an output of said integrator;
    a converter for converting an output of said adder into a corresponding voltage signal; and
    a voltage control oscillator that is controlled by an output of said converter and outputs said reproduced received clock signals to be supplied to said received data counter;
    wherein said integrator comprises:
    a memory circuit for temporarily storing an input signal to be output;
    a delay circuit for delaying an output of said memory circuit by one sample; and
    an adder for adding the output of said second attenuator to an output of said delay circuit for supply to said memory circuit.

5. A phase-locked loop circuit in a receiver for reproducing clock signals synchronized with a transmitter comprising:
    a received data counter for directly counting reproduced received clock signals according to sent data count values output from said transmitter;
    a subtracter for subtracting an output of said received data counter from said sent data count values;
    a first-order low-pass filter for filtering an output of said subtracter;
    first and second attenuators for attenuating an output of said first-order low-pass filter;
    an integrator for integrating an output of said second attenuator;
    an adder for adding an output of said first attenuator to an output of said integrator;
    a converter for converting an output of said adder into a corresponding voltage signal; and
    a voltage control oscillator that is controlled by an output of said converter and outputs said reproduced received clock signals to be supplied to said received data counter;

wherein said first-order low-pass filter comprises:

a plurality of delay circuits connected in series for delaying and issuing the output of said subtracter in sequence and for shifting a held value to the next-stage delay circuit in sequence whenever the output of said subtracter is entered; and an adder/divider for adding and summing up the output of said subtracter and an output of said delay circuit and for dividing the result of this addition by the number of stages in said delay circuits; and said integrator comprising:

a memory circuit for temporarily storing an input signal to be output;

a delay circuit for delaying an output of said memory circuit by one sample; and an adder for adding the output of said second attenuator to the output of said delay circuit for supply to said memory circuit.

6. A phase-locked loop circuit in a receiver for reproducing clock signals synchronized with a transmitter comprising:

a received data counter for directly counting reproduced received clock signals according to sent data count values output from said transmitter;

a subtracter for subtracting an output of said received data counter from said sent data count values;

a first-order low-pass filter for filtering an output of said subtracter;

first and second attenuators for attenuating an output of said first-order low-pass filter;

an integrator for integrating an output of said second attenuator;

an adder for adding an output of said first attenuator to an output of said integrator;

a converter for converting an output of said adder into a corresponding voltage signal; and a voltage control oscillator that is controlled by an output of said converter and outputs said reproduced received clock signals to be supplied to said received data counter;

wherein said first-order low-pass filter comprises:

a delay circuit for delaying input by one sample;

a first multiplier for multiplying an output of said delay circuit;

a second subtracter for subtracting an output of said first multiplier from the output of said subtracter and for supplying a result of this subtraction to said delay circuit;

an adder for adding the output of said first multiplier to the output of said second subtracter; and a second multiplier for multiplying the output of said adder; and said integrator comprising:

a memory circuit for temporarily storing an input signal to be output;

a delay circuit for delaying an output of said memory circuit by one sample; and an adder for adding the output of said second attenuator to an output of said delay circuit for supply to said memory circuit.

* * * * *